(12) United States Patent
Clinton et al.

(10) Patent No.: US 8,477,522 B2
(45) Date of Patent: Jul. 2, 2013

(54) FERROELECTRIC MEMORY WRITE-BACK

(75) Inventors: Michael Patrick Clinton, Allen, TX
(US); Steven Craig Bartling, Plano, TX
(US); Scott Summerfelt, Garland, TX
(US); Hugh McAdams, McKinney, TX
(US)

(73) Assignee: Texas Instruments Incorporated,
Dallas, TX (US)

( * ) Notice: Subject to any disclaimer, the term of this patent is extended or adjusted under 35 U.S.C. 154(b) by 137 days.

(21) Appl. No.: 13/240,252

(22) Filed: Sep. 22, 2011

(65) Prior Publication Data

US 2012/0170348 A1 Jul. 5, 2012

Related U.S. Application Data

(60) Provisional application No. 61/428,525, filed on Dec. 30, 2010.

(51) Int. Cl.
*G11C 11/22* (2006.01)
*G11C 7/00* (2006.01)
*G11C 7/22* (2006.01)

(52) U.S. Cl.
USPC ........... 365/145; 365/189.15; 365/189.16; 365/222

(58) Field of Classification Search
USPC ............................................ 365/145
See application file for complete search history.

(56) References Cited

U.S. PATENT DOCUMENTS

| 5,959,878 | A | 9/1999 | Kamp | |
|---|---|---|---|---|
| 6,256,220 | B1 | 7/2001 | Kamp | |
| 6,363,004 | B1 | 3/2002 | Kang et al. | |
| 7,212,430 | B2 * | 5/2007 | Fukushi et al. | 365/145 |
| 7,382,641 | B2 | 6/2008 | Kang et al. | |
| 7,463,502 | B2 * | 12/2008 | Stipe | 365/65 |
| 7,804,702 | B2 | 9/2010 | Madan | |
| 7,848,131 | B2 * | 12/2010 | Kim | 365/145 |
| 7,848,132 | B2 * | 12/2010 | Kim | 365/145 |
| 8,064,242 | B2 * | 11/2011 | Kim | 365/145 |

* cited by examiner

*Primary Examiner* — Son Mai
(74) *Attorney, Agent, or Firm* — John R. Pessetto; W. James Brady; Frederick J. Telecky, Jr.

(57) ABSTRACT

A self-timed sense amplifier read buffer pulls down a precharged high global bit line, which then feeds data into a tri state write back buffer that is connected directly to the bit line. The bit line provides charge to a ferroelectric capacitor to write a logical "one" or "zero" while by-passing an isolator switch disposed between the sense amplifier and the ferroelectric capacitor. Because the sense amplifier uses grounded bit line sensing, the read buffer will not start pulling down the global bit line until after the sense amplifier signal amplification, which makes the timing of the control signal for this read buffer non-critical. The write-back buffer enable timing is also self-timed off of the sense amplifier. Therefore, the read data write-back to a ferroelectric memory cell is locally controlled and begins quickly after reading data from the ferroelectric memory cell, thereby allowing a quick cycle time.

13 Claims, 7 Drawing Sheets

FERROELECTRIC MEMORY WRITE-BACK

RELATED APPLICATIONS

This application claims the benefit of U.S. Provisional Application No. 61/428,525 filed Dec. 20, 2010, which is incorporated by reference in its entirety herein.

This application is related to co-pending, co-owned U.S. patent application Ser. No. 13/240,420 entitled Ferroelectric Memory Shunt Device, filed Sep. 22, 2011, which is incorporated by reference in its entirety herein.

TECHNICAL FIELD

This invention relates generally to memory devices and more specifically to ferroelectric electric memory devices.

BACKGROUND

Various types of memory devices are known in the art for storing data used by various kinds of computing devices. Generally, memories include elements that can take one of two or more states wherein each state corresponds to a logical element used by an associated computing device. For example, many memory devices include elements that can be maintained in two states, one corresponding to a logic "zero" and a second corresponding to a logic "one." One example of a known memory device is a ferroelectric memory, also known as ferroelectric random access memory (FRAM or FeRAM). In a ferroelectric memory device, the element that can assume two states is a ferroelectric capacitor.

A ferroelectric capacitor, when biased with a voltage, maintains an electric potential when the bias voltage is removed. The ferroelectric capacitor can maintain this electric potential without application of an outside power source. So configured, a ferroelectric device based memory can maintain its stored state in the absence of the application of electricity, thereby making it a low-power option for a memory device. When a ferroelectric memory device is read, however, the state of the ferroelectric device is erased. To maintain the previous state, the ferroelectric element must be rewritten with the previous state after reading. This rewrite process can delay a cycle time for a ferroelectric device, thereby decreasing the speed at which ferroelectric memory device can operate. Moreover, it may be necessary to clear charge from a ferroelectric memory bit cell either at the end of a read cycle or at the beginning of a new read cycle. Clearing charge from the ferroelectric memory device can further delay the cycle time, which further degrades the speed performance for the memory device.

In certain known FRAM devices, an isolator switch is placed between the ferroelectric capacitor and the sense amplifier to allow fast sense amplifier setting and signal amplification because of the resistive decoupling of the sense amplifier from the ferroelectric capacitor elements provided by the isolator switch. The isolator switch, however, prevents automatic write back of data to the ferroelectric capacitor by the sense amplifier. To write a state back onto the ferroelectric capacitor in FRAMs using an isolator switch, the data signal needed to be boosted significantly, and the sense amplifier 650 needed extra time to sink or source charge needed for write back.

SUMMARY

Generally speaking, pursuant to these various embodiments, a method of operating a ferroelectric memory device includes using a self-timed sense amplifier read buffer to pull down a pre-charged high global bit line, which then feeds data into a tri state write back buffer that is connected directly to the bit line. The bit line provides charge to a ferroelectric capacitor to write a logical "one" or "zero" to the ferroelectric capacitor by changing the state of the ferroelectric capacitor. Because the sense amplifier uses grounded bit line sensing, the read buffer will not start pulling down the global bit line until after the sense amplifier signal amplification, which makes the timing of the control signal for this read buffer non-critical. The write-back buffer enable timing is also self-timed off of the sense amplifier. Therefore, the read data write-back to a ferroelectric memory cell is locally controlled and begins quickly after reading data from the ferroelectric memory cell, thereby allowing a quick cycle time.

The cycle time of a high performance ferroelectric memory can be further improved by including a shunt switch configured to short both sides of the ferroelectric capacitor of the ferroelectric memory device. The shunt switch is configured therefore to remove excess charge from around the ferroelectric capacitor prior to or after reading data from the ferroelectric capacitor. By one approach, the shunt switch is connected to operate in reaction to signals from the same line that controls accessing the ferroelectric capacitor. So configured, the high performance cycle time of the ferroelectric memory device is reduced by eliminating delays used to otherwise drain excess charge from around the ferroelectric capacitor. The shunt switch also improves reliability of the ferroelectric memory device by ensuring that excess charge does not affect the reading of the ferroelectric capacitor during a read cycle. The combined application of these teachings results in a ferroelectric memory configured to operate with a read/write cycle time of at least 50 MHz.

BRIEF DESCRIPTION OF THE DRAWINGS

The above needs are at least partially met through provision of the ferroelectric memory write-back described in the following detail description, particularly when studied in conjunction with the drawings wherein.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above except where different specific meanings have otherwise been set forth herein.

DETAILED DESCRIPTION

Figure 1:
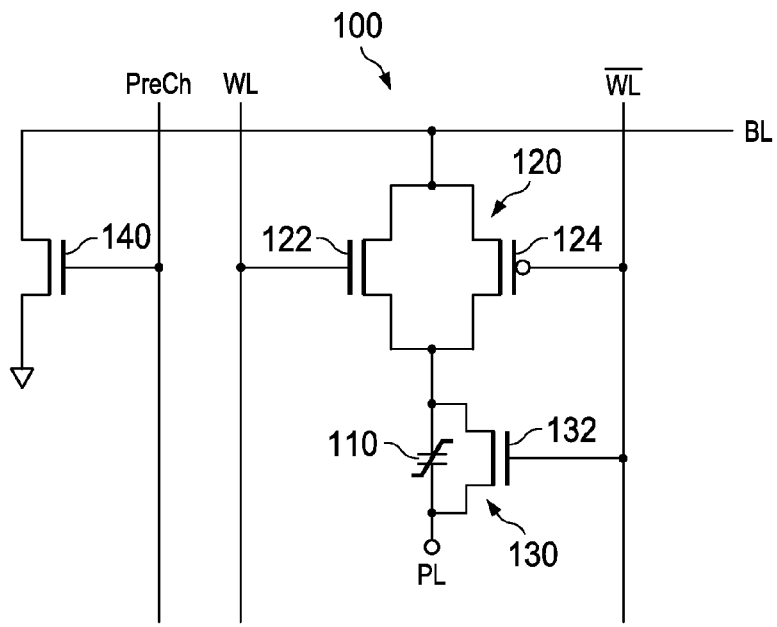
FIG. 1 comprises a circuit diagram of an example ferroelectric bit cell with a shunt device as configured in accordance with various embodiments of the invention.

With reference to FIG. 1, an example ferroelectric memory apparatus with a shunt device includes a bit cell 100 that includes a ferroelectric capacitor 110 electrically coupled to a plate line PL. A transmission gate 120 is coupled between the ferroelectric capacitor 110 and a bit line BL. The transmission gate 120 includes an nmos gate 122 electrically coupled to a word line WL and a pmos gate 124 electrically coupled to a compliment word line WL-bar. An nmos switch 130 is electrically coupled across the ferroelectric capacitor 110 with a gate 132 of the nmos switch 130 electrically coupled to the compliment word line WL-bar to shunt the ferroelectric capacitor 110 in response to deactivation of the compliment word line WL-bar. In one approach, the transmission gate 120 comprises cmos gate. In this example, a pre-charge switch 140 is electrically coupled to the bit line BL to selectively apply a pre-charge to the bit line BL in response to signaling received via a pre-charge line PreCh electrically coupled to a gate of the pre-charge switch 140. The pre-charge line PreCh is configured to activate and deactivate the pre-charge switch 140 at approximately a same time as deactivation and activation respectively of the compliment word line WL-bar.

Figure 2:
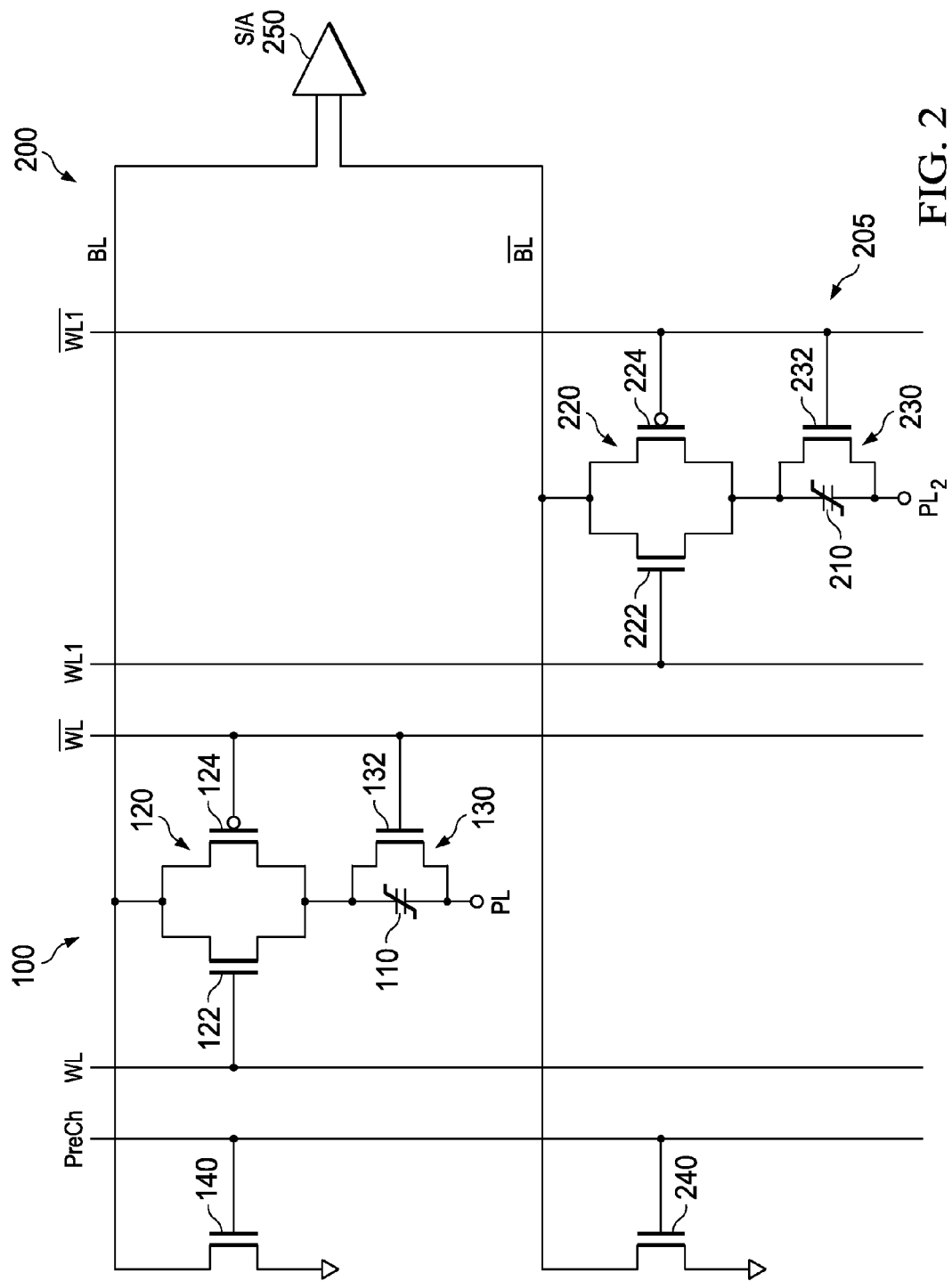
FIG. 2 comprises circuit diagram of an example dual bit cell ferroelectric memory device as configured in accordance with various embodiments of the invention.

With reference to FIG. 2, an example approach where the shunt switch is applied to a two capacitor bit cell will be described. The dual capacitor bit cell 200 includes a compliment bit cell 205 that includes a second ferroelectric capacitor 210 electrically coupled to a second plate line $PL_2$. A second transmission gate 220 is coupled between the second ferroelectric capacitor 210 and a compliment bit line BL-bar. The second transmission gate 220 includes a second nmos gate 222 electrically coupled to a second word line WL1 and a second pmos gate 224 electrically coupled to a second compliment word line WL1-bar. A second nmos switch 230 is electrically coupled across the second ferroelectric capacitor 210 with a second gate 232 of the second nmos switch 230 electrically coupled to the second compliment word line WL1-bar to shunt the second ferroelectric capacitor 210 in response to activation of the second compliment word line WL1-bar. In one approach, the word line WL and the second word line WL1 are tied together and operate together, and the compliment word line WL-bar and the second compliment word line WL1-bar are tied together and operate together to reduce signal controlling complexity. Similarly, the first plate line PL and the second plate line $PL_2$ can be tied together and operate together.

This four transistor and two capacitor ("4T2C") approach (six transistors if one includes the shunt transistors 130 and 230) uses the same basic architectural approach as the 2T1C topology described above with reference to FIG. 1 except now both write lines are utilized to store both the true data as well as a complementary form of that data. Such an approach tends to halve circuit density but effectively doubles the signal that is available for sensing and hence tends to ensure a more reliable memory circuit.

The sense amplifier 250 and the pre-charge line PreCh are common between the bit cell 100 and the compliment bit cell 205. A second pre-charge switch 240 is electrically coupled to the compliment bit line BL-bar to selectively apply a pre-charge to the compliment bit line BL-bar in response to signaling received via the pre-charge line PreCh electrically coupled to a gate of the pre-charge switch 240. The pre-charge line PreCh is configured to activate and deactivate the pre-charge switch 240 at approximately the same time as deactivation and activation respectively of the second compliment word line WL1-bar and the compliment word line WL0-bar. The ferroelectric memory apparatus 200 further includes a sense amplifier 250 electrically coupled to the bit line BL and the compliment bit line BL-bar to sense the voltage from the ferroelectric capacitors 110 and 210 to determine the state of the capacitors when reading the ferroelectric memory apparatus.

Figure 3:
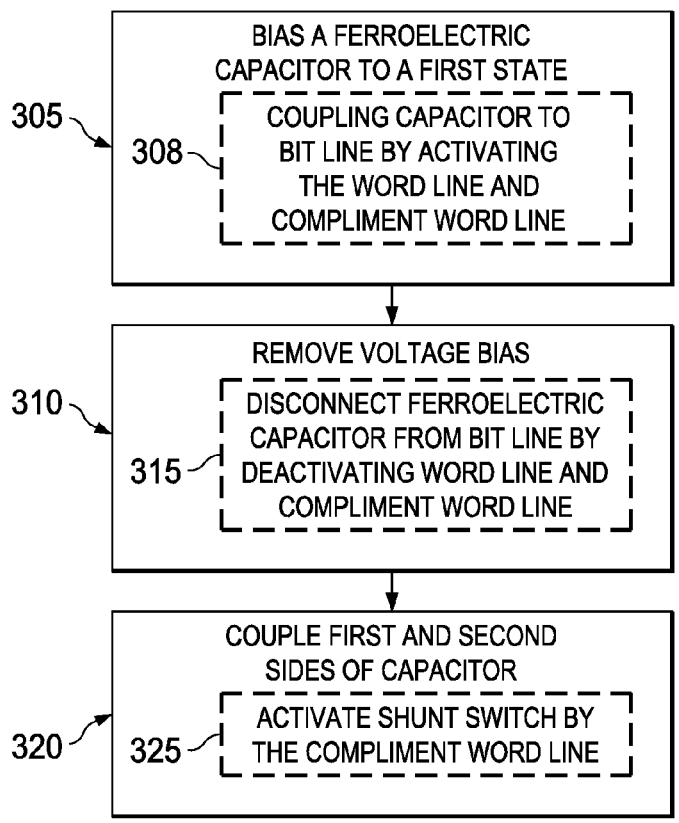
FIG. 3 comprises a flow chart of the operation of an example ferroelectric memory device incorporating a shunt switch as configured in accordance with various embodiments of the invention.

With reference to FIG. 3, a method of operating a ferroelectric device having a shunt device will be described. The method includes biasing 305 a ferroelectric capacitor to a first state by applying a voltage across the ferroelectric capacitor and removing 310 the voltage bias. In one approach, biasing the ferroelectric capacitor includes coupling 308 the ferroelectric capacitor to the bit line through the transmission gate by activating the word line and the compliment word line. The biasing may also include deactivating the shunt switch through activating the compliment word line. Removing 310 the voltage in one example includes electrically disconnecting 315 the ferroelectric capacitor from the bit line through a transmission gate by deactivating a word line and a compliment word line. The word line and the compliment word line are respectively electrically connected to gate elements of the transmission gate. At 320, a first side of the ferroelectric capacitor is electrically coupled to a second side of the ferroelectric capacitor through a shunt switch. The electric coupling in one approach is performed in response to activation 325 of the shunt switch by the compliment word line. So configured, electrically coupling a first side of the ferroelectric capacitor to a second side of the ferroelectric capacitor removes charge build up between the ferroelectric capacitor and the transmission gate in response to deactivation of the compliment word line.

By having the shunt switch controlled via signaling off the compliment word line, which also controls other aspects of the operation of the ferroelectric capacitor, the shunt switch is automatically controlled to provide minimum delays while achieving its purpose of minimizing excess charge around the ferroelectric capacitor. For example, the method of operating the ferroelectric memory device may include reading the first state from the ferroelectric capacitor. By one approach, reading the first state includes activating the word line and the compliment word line, which also deactivates the shunt switch. In another approach, the method includes applying a pre-charge to the bit line before activating the word line and the compliment word line, where activating the compliment word line deactivates the shunt switch. In still another approach, the method of operating the ferroelectric memory device may include applying the pre-charge to the bit line together with deactivating the word line and the compliment word line, which deactivating the compliment word line activates the shunt switch. So configured, the pre-charge need not be applied to the ferroelectric capacitor after activation of the word line to clear charge build up at the capacitor. Instead, the word line and the pre-charge line can be activated or deactivated concurrently thereby eliminating the delay time.

Figure 4:
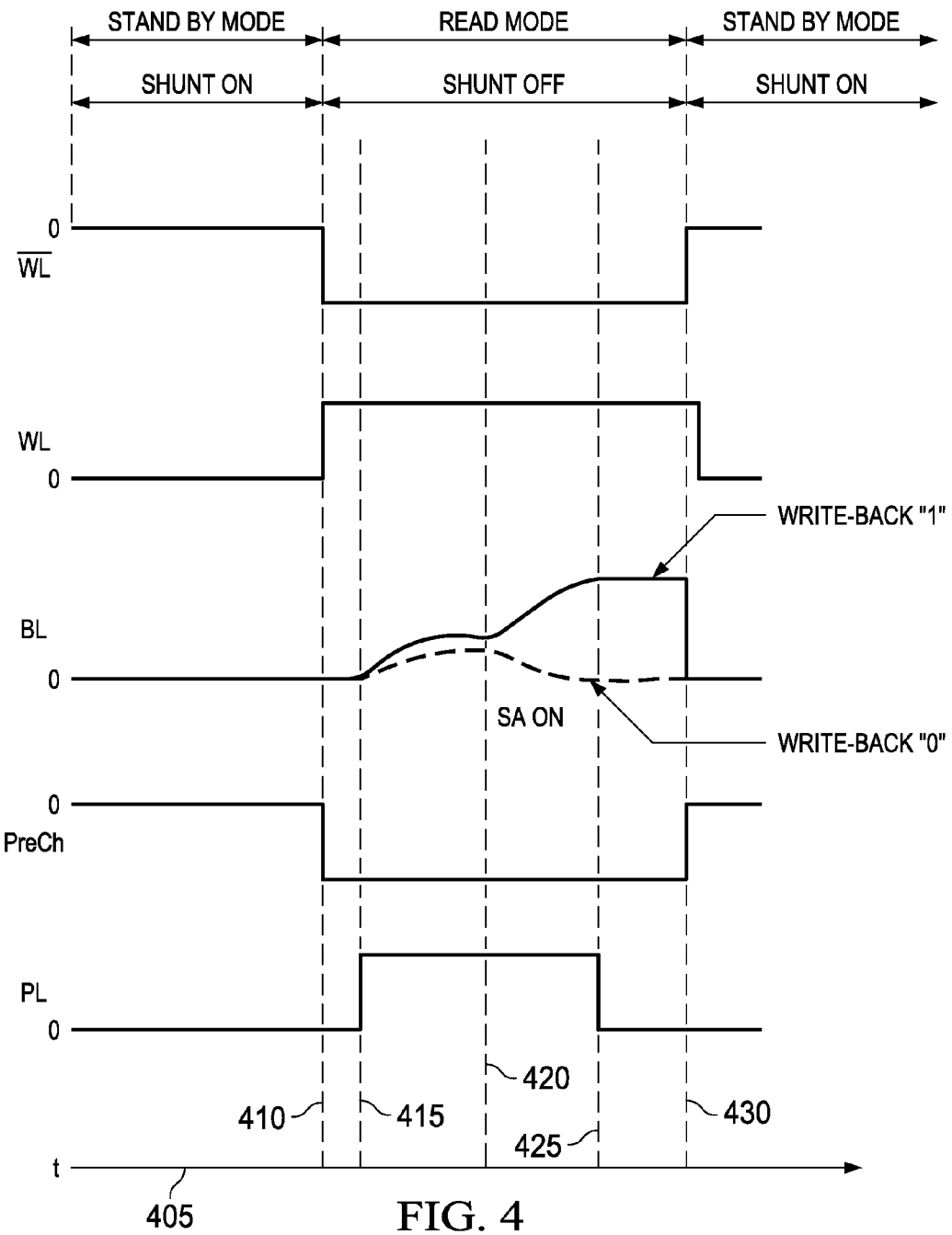
FIG. 4 comprises a signal diagram showing the signals at various points of the circuit of FIG. 2 over a common time period.

With reference to FIG. 4, this timing will be explained. FIG. 4 includes example signals for each of the compliment word line WL-bar, word line WL, bit line BL, pre-charge line PreCh, and plate line PL for an example operation of the ferroelectric memory device such as the example of FIG. 1. In the first time segment 405, the ferroelectric device is in a standby mode. During this state, the bit line BL is at zero as well as the plate line PL. The pre-charge line PreCh is activated to provide a pre-charge to the bit line BL, stabilizing the charge to the bit line BL during the standby mode. At time 410, the ferroelectric memory device is switched to a read mode in order to read the state of the ferroelectric capacitor at which time the word line WL and compliment word line WL-bar are activated and the pre-charge line PreCh is deactivated. By activating the compliment WL, the shunt switch is turned off, thereby removing the short across the ferroelectric capacitor. Shortly after time 410, the PL pulses at a time 415 to apply a voltage pulse to a ferroelectric capacitor, which in turn provides a signal on the bit line BL. This period of time between time 410 and 415 is thus called the WL drive time. Depending on the state of the ferroelectric capacitor, the bit line BL will provide a signal that corresponds to and identifies the previously state of the ferroelectric capacitor. Between time 415 and time 420, a signal develops on the bit line BL such that this time period is called the signal development phase. At time 420, the sense amplifier is turned on to sense the signal on the bit line BL. After sensing the signal on the bit line BL, a new data bit is stored in the ferroelectric capacitor by setting the ferroelectric capacitor to one of two states. The signal on the bit line BL during the read state indicates the relative signals for the example ferroelectric capacitor corresponding to a logical "one" or a logical "zero." At time 425, the plate line PL drops back to zero because the plate line PL pulsing is no longer necessary to read the state of the ferroelectric capacitor. At time 430, the pre-charge line PreCh activates at about the same time that the word line WL and the compliment word line WL deactivate. The shunt switch in turn is reactivated in response to the deactivation of the compliment word line WL. Accordingly the ferroelectric memory device is back in a stand by mode.

Figure 5:
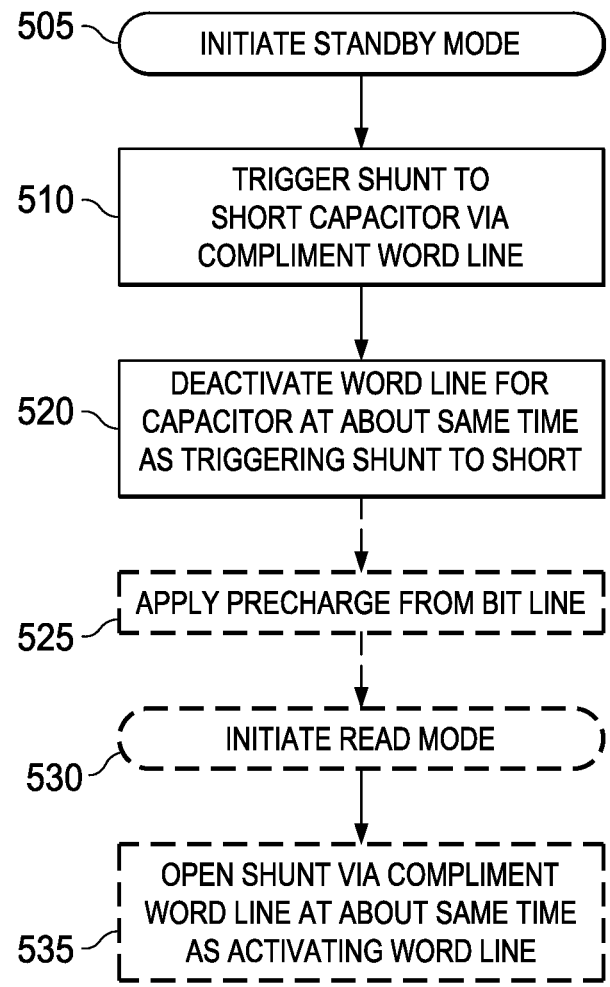
FIG. 5 comprises a flow diagram of an operation of an example ferroelectric memory device including a shunt switch as configured in accordance with various embodiments of the invention.

With reference to FIG. 5, a method of operating a ferroelectric memory device with a shunt switch between two states will be described. The method includes initiating 505 a standby mode of operation for a ferroelectric memory. The initiating includes triggering 510 a shunt device coupled across a ferroelectric capacitor to short a first side of the ferroelectric capacitor to a second side of the ferroelectric capacitor via a compliment word line for the ferroelectric capacitor electrically coupled to the shunt device. One approach to triggering the shunt device may include triggering an NMOS coupled across the ferroelectric capacitor to short the first side of the ferroelectric capacitor to the second side of the ferroelectric capacitor via the compliment WL coupled to a gate of the NMOS switch. The initiating the standby mode also includes deactivating 520 a word line for the ferroelectric capacitor at approximately a same time as triggering the shunt device via the compliment word line. Initiating the standby mode may also include 525 applying a pre-charge from a bit line for the ferroelectric capacitor after triggering the shunt device via the compliment word line. The method may further include initiating 530 a read mode for the ferroelectric memory by opening 535 the shunt device via the compliment word line at approximately the same time as activating the word line. By one approach initiating the read mode may further include applying a pre-charge to a bit line connected to the ferroelectric capacitor through a switch prior to activating the word line.

Figure 6:
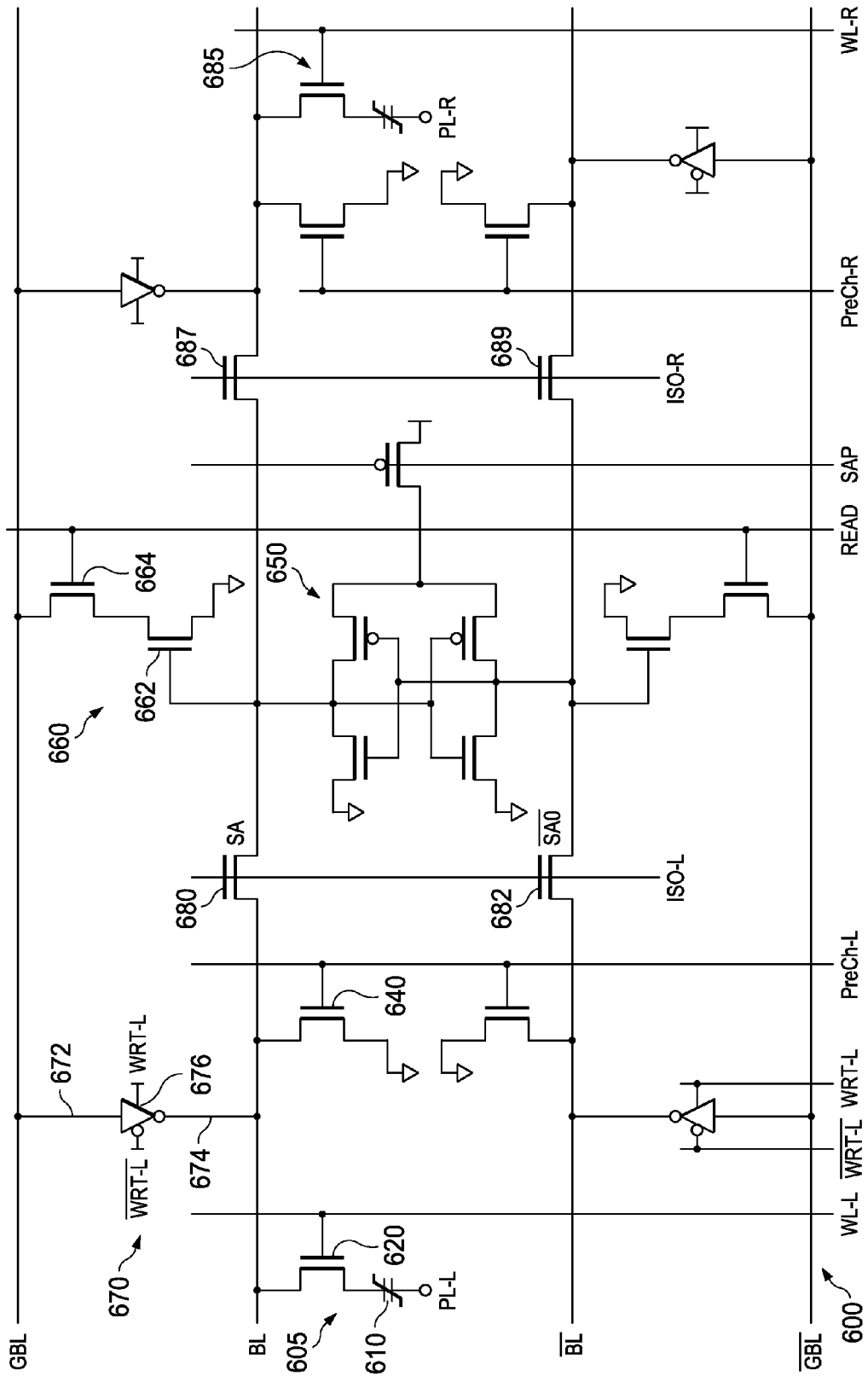
FIG. 6 comprises a circuit diagram of an example circuit incorporating a write-back scheme for ferroelectric memory device as configured in accordance with various embodiments of the invention.

With reference to FIG. 6, an example ferroelectric memory apparatus 600 using a sense amplifier triggered data write back method will be described. The ferroelectric memory apparatus 600 includes a bit cell 605 that includes a ferroelectric capacitor 610 electrically coupled to a plate line PL-L. A switch 620 is coupled between the ferroelectric capacitor 610 and a bit line BL, wherein the switch 620 is controlled at least in part by a word line WL-L. The example ferroelectric memory apparatus 600 includes a precharge switch 640 electrically coupled to the bit line BL to selectively apply a precharge to the bit line BL in response to signaling received via a precharge line PreCh-L electrically coupled to a gate of the precharge switch 640. The example ferroelectric memory apparatus 600 includes a sense amplifier 650, which in this example includes four switches in a known configuration for use as an amplifier.

The example ferroelectric memory apparatus 600 further includes a read buffer 660 configured to apply a voltage to a global bit line GBL in response to signal amplification of the bit line BL during reading of the bit cell 605 and a signal received from a read line READ coupled to the read buffer 660. By one approach, the read buffer 660 includes two switches 662 and 664 electrically coupled between the global bit line GBL and a reference voltage. In this example, a first read buffer switch 662 of the two switches is electrically coupled to be controlled by the bit line BL, and the second read buffer switch 664 of the two switches is electrically coupled to be controlled by the signal received from the read line READ. So configured, the read buffer 660 automatically biases the global bit line GBL in response to reading the state from the ferroelectric capacitor 610, which reduces lag time in starting the write-back process.

The example ferroelectric memory apparatus 600 also includes a tri-state buffer 670 having an input 672 electrically coupled to the global bit line GBL. An output 674 of the tri-state buffer 670 is electrically coupled to the bit line BL and configured to output a signal derived from the global bit line GBL to the bit line BL. A control input 676 of the tri-state buffer 670 is electrically coupled to a write line WRT to receive a signal regarding the signal to pass to the bit line BL for writing data to the bit cell 605. For example, after reading a state from the ferroelectric capacitor 610, the read buffer 660 will have pulled the global bit line GBL to a level sufficient to write a state back to the ferroelectric capacitor 610 via the bit line BL.

The write line WRT or a compliment write line WRT bar controls when the level of the global bit line GBL is provided to the bit line BL and whether a second level is provided to write a second state to the ferroelectric capacitor. Because the pulling of the global bit line GBL is triggered by the sense amplifier 650, timing delay for this portion of the write back operation is largely eliminated. The write line WRT and compliment write line WRT-bar is driven by a separate write back driver (not shown) that is triggered by reading the data from the sense amplifier 605, making the entire write back process nearly completely self timed.

Referring again to FIG. 6, an isolator switch 680 is disposed in the bit line BL between the bit cell 605 and the sense amplifier 650. The isolator switch 680 is controlled by an isolator control line ISO-L and is configured to close during reading of the bit cell 605. In known FRAM devices, the use of an isolator switch 680 prevents automatic write back of data to the ferroelectric capacitor 610 by the sense amplifier 650 while providing the benefits of allowing fast sense amplifier 650 setting and signal amplification because of the resistive decoupling of the sense amplifier 650 from the ferroelectric capacitor elements provided by the isolator switch 680. To write a state back onto the ferroelectric capacitor 610 in FRAMs using an isolator switch 680, the data signal needed to be boosted significantly, and the sense amplifier 650 needed extra time to sink or source charge needed for write back. Routing the write back signal around the isolator switch 680 via the read buffer 660 and the global bit line GBL avoids these detriments of the use of isolator switches. As shown in FIG. 6, the tri-state buffer 670 is electrically coupled to the bit cell 605 side of the bit line BL relative to the isolator switch 680, and the read buffer 660 is electrically coupled to the sense amplifier 650 side of the bit line BL relative to the isolator switch 680. So configured, the speed benefits of using an isolator switch between the ferroelectric capacitor components and the sense amplifier can be realized while largely eliminating the extra effort and time wasted in needing to boost the write back signal to write a state onto the ferroelectric capacitor through the isolator switch. Such a write-back approach as described herein can improve a read/write cycle time for an FRAM device by as much as 20%.

The example of FIG. 6 includes additional elements to round out a mirrored circuit design where a single sense amplifier 650 can be used for two bit cells 605 and 685. The elements associated with the left bit cell 605 are designated with an "L" while the elements associated with the right bit cell 685 are designated with an "R." One of skill in the art will recognize that the elements on either side operate in the same manner where isolator switches 680 and 682 are opened to cut off the left side elements while the sense amplifier 650 is dedicated to a read/write cycle of the right side elements and the reverse is true with respect to the right side isolator switches 687 and 689. Additional elements include a precharge line PreCh-L is configured to activate and deactivate the precharge switch 640 at approximately a same time as deactivation and activation, respectively, of a compliment word line WL-L-bar, similar to the operation described above with respect to precharge line applications for the shunt device. A compliment structure with elements designated a "compliment" are included as well to provide additional signal strength in reading a state from a bit cell.

Figure 7:
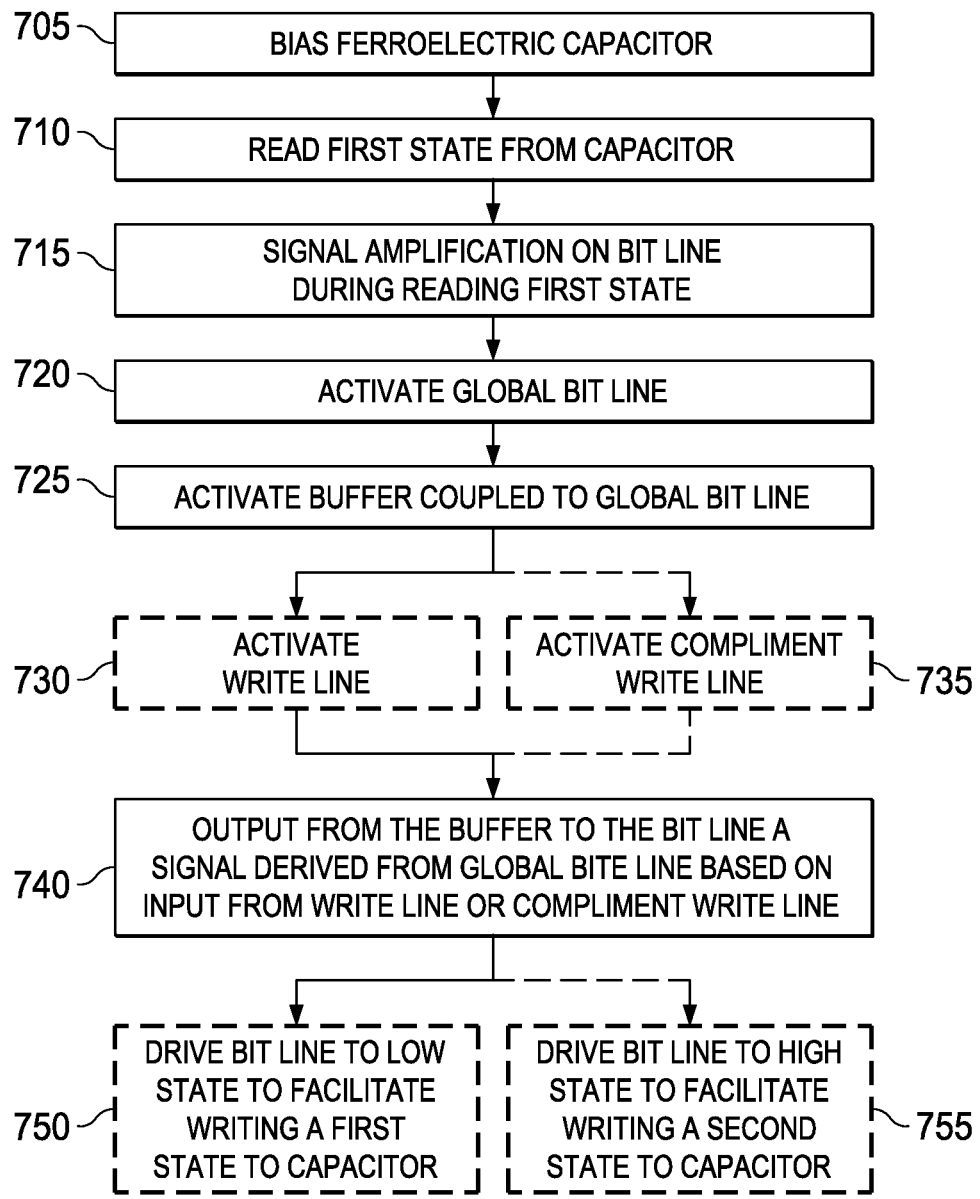
FIG. 7 comprises a flow chart of the operation of an example ferroelectric memory device operation including a write-back scheme as configured in accordance with the various embodiments of the invention.

An example method of operation of a ferroelectric memory device such as that of FIG. 6 will be described with reference to FIG. 7. The method includes biasing 705 a ferroelectric capacitor to a first state by applying a voltage across the ferroelectric capacitor and removing the voltage. Removing the voltage by one approach includes electrically disconnecting the ferroelectric capacitor from a bit line through a switch that connects the ferroelectric capacitor to the bit line. A first state is read 710 from the ferroelectric capacitor via the bit line electrically connected to the ferroelectric capacitor through the switch. In response to signal amplification 715 on the bit line during reading the first state, a global bit line is activated 720 that in response activates 725 a buffer electrically coupled to the global bit line. Reading the first state, for example, includes activating a word line and a compliment word line. After activating the word line and the compliment word line, a plate line electrically coupled to the ferroelectric capacitor is pulsed, and after pulsing the plate line, a sense amplifier electrically coupled to the bit line and bit line compliment is activated.

The buffer has an output electrically coupled to the bit line and is electrically coupled to a write line. The buffer is configured to output to the bit line a signal derived from the global bit line based on an input received from the write line. For example, the method of FIG. 7 may further include activating 730 the write line to trigger the buffer to output 740 a first signal configured to drive 750 the bit line to a low state to facilitate writing a first state to the ferroelectric capacitor. If a second state is to be written to the ferroelectric capacitor, a compliment write line electrically coupled to the buffer is activated 735 to trigger the buffer to output 740 a second signal configured to drive 755 the bit line to a high state to facilitate writing a second state to the ferroelectric capacitor.

Figure 8:
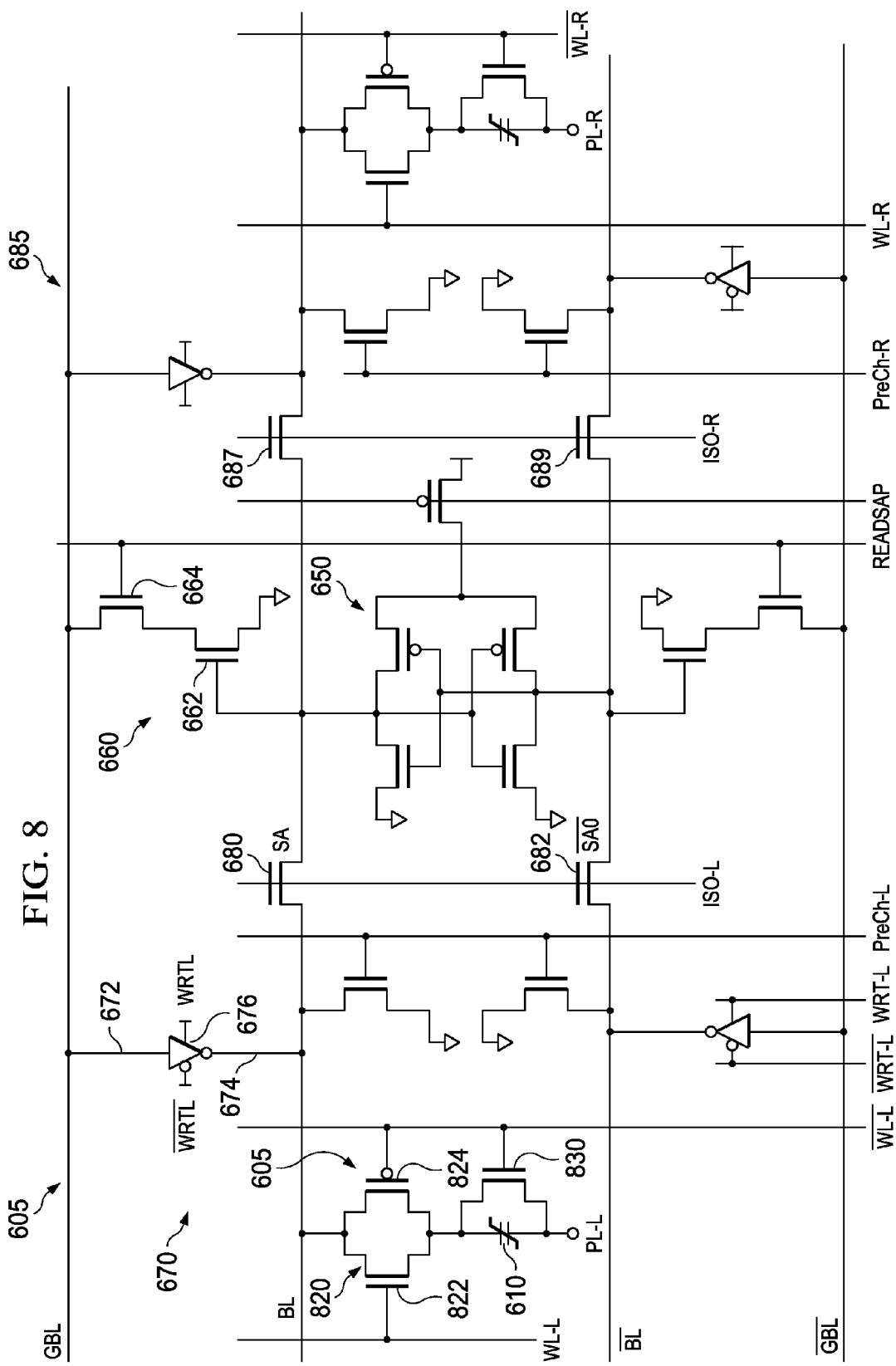
FIG. 8 comprises a circuit diagram of an example ferroelectric memory device including a write-back scheme and shunt switches as configured in accordance with various embodiments of the invention.

Although two separate approaches to reducing a read/write cycle of a ferroelectric memory device are described above, the two approaches can be combined to yield further improved operation characteristics. One example combined approach is shown in FIG. 8, which depicts a circuit like that of FIG. 6 modified to include shunt devices such as those described above with respect to FIGS. 1-5. The modification includes electrically coupling a first side of the ferroelectric capacitor 610 to a second side of the ferroelectric capacitor 610 through a shunt switch 830 in response to activation of the shunt switch 830 by the compliment word line WL-L-bar. The shunt switch 830 electrically couples the two sides to remove charge build up between the ferroelectric capacitor 610 and the switch 620, which in the example of FIG. 8 is a transmission gate 820 such as a cmos gate having an nmos 822 gate electrically coupled to the word line WL-L and a pmos gate 824 electrically coupled to a compliment word line WL-L-bar. These elements operate in the manner described above with respect to FIGS. 1-5. Similar elements are added to the right side of the circuit of FIG. 8 and operate in the same manner.

So configured, the performance benefits of the write back approach discussed herein can be combined with the performance benefits of adding the shunt switch also discussed herein. Each approach speeds the read/write cycle for a FRAM device designed according to these teachings. Accordingly, a bit cell including a ferroelectric capacitor electrically coupled to a plate line and configured to store a logical "1" or a logical "0" and a switch coupled between the ferroelectric capacitor and a bit line, the switch controlled at least in part by a word line, can operate together with a sense amplifier electrically coupled to the bit line to read the logical "1" or the logical "0" from the bit cell to operate with a read/write cycle time of at least 50 MHz and up to 100 MHz.

Those skilled in the art will recognize that a wide variety of modifications, alterations, and combinations can be made with respect to the above described embodiments without departing from the scope of the invention, and that such modifications, alterations, and combinations are to be viewed as being within the ambit of the inventive concept.

What is claimed is:

1. A method of operating a ferroelectric memory device, the method comprising:
   biasing a ferroelectric capacitor to a first state by applying a voltage across the ferroelectric capacitor and removing the voltage;
   reading a first state from the ferroelectric capacitor via a bit line electrically connected to the ferroelectric capacitor through a switch;
   in response to signal amplification on the bit line during reading the first state, activating a global bit line that in response activates a buffer electrically coupled to the global bit line, the buffer having an output electrically coupled to the bit line;

wherein the buffer is electrically coupled to a write line and is configured to output to the bit line a signal derived from the global bit line based on an input received from the write line;

wherein reading the first state comprises:

activating a word line and a compliment word line;

after activating the word line and the compliment word line, pulsing a plate line electrically coupled to the ferroelectric capacitor; and after pulsing the plate line, activating a sense amplifier electrically coupled to the bit line and bit line compliment.

2. A method of operating a ferroelectric memory device, the method comprising:

biasing a ferroelectric capacitor to a first state by applying a voltage across the ferroelectric capacitor and removing the voltage;

reading a first state from the ferroelectric capacitor via a bit line electrically connected to the ferroelectric capacitor through a switch;

in response to signal amplification on the bit line during reading the first state, activating a global bit line that in response activates a buffer electrically coupled to the global bit line, the buffer having an output electrically coupled to the bit line;

wherein the buffer is electrically coupled to a write line and is configured to output to the bit line a signal derived from the global bit line based on an input received from the write line;

wherein removing the voltage comprises electrically disconnecting the ferroelectric capacitor from the bit line through the switch, which comprises a transmission gate, by deactivating the word line and a compliment word line, the word line and the compliment word line respectively electrically coupled to gate elements of the transmission gate.

3. The method of claim 2 further comprising:

electrically coupling a first side of the ferroelectric capacitor to a second side of the ferroelectric capacitor through a shunt switch in response to activation of the shunt switch by the compliment word line;

wherein electrically coupling a first side of the ferroelectric capacitor to a second side of the ferroelectric capacitor removes charge build up between the ferroelectric capacitor and the transmission gate in response to deactivation of the compliment word line.

4. A method of operating a ferroelectric memory device, the method comprising:

biasing a ferroelectric capacitor to a first state by applying a voltage across the ferroelectric capacitor and removing the voltage;

reading a first state from the ferroelectric capacitor via a bit line electrically connected to the ferroelectric capacitor through a switch;

in response to signal amplification on the bit line during reading the first state, activating a global bit line that in response activates a buffer electrically coupled to the global bit line, the buffer having an output electrically coupled to the bit line;

wherein the buffer is electrically coupled to a write line and is configured to output to the bit line a signal derived from the global bit line based on an input received from the write line;

wherein biasing the ferroelectric capacitor comprises coupling the ferroelectric capacitor to the bit line through transmission gate by activating the word line and the compliment word line.

5. A method of operating a ferroelectric memory device, the method comprising:

biasing a ferroelectric capacitor to a first state by applying a voltage across the ferroelectric capacitor and removing the voltage;

reading a first state from the ferroelectric capacitor via a bit line electrically connected to the ferroelectric capacitor through a switch;

in response to signal amplification on the bit line during reading the first state, activating a global bit line that in response activates a buffer electrically coupled to the global bit line, the buffer having an output electrically coupled to the bit line;

wherein the buffer is electrically coupled to a write line and is configured to output to the bit line a signal derived from the global bit line based on an input received from the write line;

wherein biasing the ferroelectric capacitor comprises deactivating shunt switch through activating the compliment word line.

6. A method of operating a ferroelectric memory device, the method comprising:

biasing a ferroelectric capacitor to a first state by applying a voltage across the ferroelectric capacitor and removing the voltage;

reading a first state from the ferroelectric capacitor via a bit line electrically connected to the ferroelectric capacitor through a switch;

in response to signal amplification on the bit line during reading the first state, activating a global bit line that in response activates a buffer electrically coupled to the global bit line, the buffer having an output electrically coupled to the bit line;

wherein the buffer is electrically coupled to a write line and is configured to output to the bit line a signal derived from the global bit line based on an input received from the write line;

further comprising reading the first state from the ferroelectric capacitor, wherein reading the first state comprises:

activating the word line and the compliment word line, which also deactivates a shut switch coupled across the ferroelectric capacitor.

7. The method of claim 6 further comprising applying a precharge to the bit line before activating the word line and the complement word line, which activating the complement word line deactivates the shunt switch.

8. A ferroelectric memory apparatus comprising:

a bit cell comprising:

a ferroelectric capacitor electrically coupled to a plate line, and a switch coupled between the ferroelectric capacitor and a bit line, the switch controlled at least in part by a word line;

a sense amplifier electrically coupled to the bit line;

a read buffer configured to apply a voltage to a global bit line in response to signal amplification of the bit line during reading of the bit cell and a signal received from a read line coupled to the read buffer;

a tri-state buffer comprising:

an input electrically coupled to the global bit line, an output electrically coupled to the bit line and configured to output a signal derived from the global bit line to the bit line, a control input electrically coupled to a write line to receive a signal regarding the signal to pass to the bit line for writing data to the bit cell.

9. The ferroelectric memory apparatus of claim 8 further comprising an isolator switch in the bit line between the bit cell and the sense amplifier, the isolator switch configured to close during reading of the bit cell, and wherein the tri-state buffer is electrically coupled to the bit cell side of the bit line relative to the isolator switch and the read buffer is electrically coupled to the sense amplifier side of the bit line relative to the isolator switch.

10. The ferroelectric memory apparatus of claim 8 wherein the read buffer comprises two switches electrically coupled between the global bit line and a reference voltage, wherein a first read buffer switch of the two switches is electrically coupled to be controlled by the bit line and the second read buffer switch of the two switches is electrically coupled to be controlled by the signal received from the read line.

11. The ferroelectric memory apparatus of claim 8 further comprising a precharge switch electrically coupled to the bit line to selectively apply a precharge to the bit line in response to signaling received via a precharge line electrically coupled to a gate of the precharge switch, wherein the precharge line is configured to activate and deactivate the precharge switch at approximately a same time as deactivation and activation, respectively, of the compliment word line.

12. The ferroelectric memory apparatus of claim 8 wherein the switch coupled between the ferroelectric capacitor and the bit line comprises a transmission gate coupled between the ferroelectric capacitor and the bit line, the transmission gate having an nmos gate electrically coupled to a word line and a pmos gate electrically coupled to a compliment word line;

wherein the bit cell further comprises an nmos switch electrically coupled across the ferroelectric capacitor with a gate of the nmos switch electrically coupled to the compliment word line to shunt the ferrocelectric capacitor in response to deactivation of the compliment word line.

13. The ferroelectric memory apparatus of claim 8 wherein the transmission gate comprises a cmos gate.

* * * * *